(12) United States Patent
Almogy

(10) Patent No.: US 6,897,941 B2
(45) Date of Patent: May 24, 2005

(54) OPTICAL SPOT GRID ARRAY PRINTER

(75) Inventor: Gilad Almogy, Givataim (IL)

(73) Assignee: Applied Materials, Inc., Santa Clara, CA (US)

( * ) Notice: Subject to any disclaimer, the term of this patent is extended or adjusted under 35 U.S.C. 154(b) by 23 days.

(21) Appl. No.: 10/289,201

(22) Filed: Nov. 7, 2002

(65) Prior Publication Data

US 2003/0123040 A1 Jul. 3, 2003

Related U.S. Application Data

(60) Provisional application No. 60/331,029, filed on Nov. 7, 2001.

(51) Int. Cl.[7] .................. G03B 27/54; G03B 27/42; G03B 27/72; G03C 5/00
(52) U.S. Cl. ............... 355/67; 355/53; 355/69; 355/70; 430/30; 430/311
(58) Field of Search ............... 355/69, 70, 53, 355/67, 77; 430/5, 30, 311, 312, 396, 397; 359/224

(56) References Cited

U.S. PATENT DOCUMENTS

| | | | |
|---|---|---|---|
| 3,617,125 A | 11/1971 | Sobottke | 355/46 |
| 3,861,804 A | 1/1975 | Lehmbeck | 356/108 |
| 3,877,801 A | 4/1975 | MacGovern | 353/38 |
| 3,973,953 A | 8/1976 | Montgomery | 96/1 |
| 3,973,954 A | 8/1976 | Bean | 96/1 |
| 4,272,186 A | 6/1981 | Plummer | 355/34 |
| 4,353,628 A | 10/1982 | Berman | 354/5 |
| 4,377,753 A | 3/1983 | Mir | 250/578 |
| 4,455,485 A | 6/1984 | Hosaka et al. | 250/234 |
| 4,464,030 A | 8/1984 | Gale et al. | 354/4 |
| 4,465,934 A | 8/1984 | Westerberg et al. | 250/398 |
| 4,498,742 A | 2/1985 | Uehara | 350/523 |
| 4,619,508 A | 10/1986 | Shibuya et al. | 353/122 |
| 4,668,080 A | 5/1987 | Gale et al. | 355/51 |
| 4,680,855 A | 7/1987 | Yamazaki et al. | 29/583 |

(Continued)

FOREIGN PATENT DOCUMENTS

| | | | |
|---|---|---|---|
| EP | 0368482 | 10/1989 | G02B/3/00 |
| EP | 0485803 | 10/1991 | G02B/21/00 |
| EP | 0486316 | 11/1991 | G03F/7/20 |
| EP | 0558781 | 3/1992 | G03F/7/20 |
| EP | 0707237 | 10/1995 | G03F/7/20 |

(Continued)

OTHER PUBLICATIONS

"High throughput electron lithography with the multiple aperture pixel by pixel enhancement of resolution concept", Kruit, P., J. Vac. Sci. Technol. B 16(6), Nov./Dec. 1998.

"A proposal for maskless, zone–plate–array nanolithography", Smith, Henry I., J. Vac. Sci. Techno. B 14(6), Nov./Dec. 1996.

(Continued)

Primary Examiner—Alan Mathews
(74) Attorney, Agent, or Firm—McDermott, Will & Emery

(57) ABSTRACT

A high resolution and high data rate spot grid array printer system is provided, wherein an image is formed by scanning spot-grid array of optical beams across a substrate layered with a resist. High resolution is achieved by apodizing the optical beams to provide a narrower main lobe. Unwanted recordation of side lobes upon the substrate is prevented by assuring that the side lobes do not include energy above the threshold of the resist, using a memoryless resist, and by using a slanted and interleaved scan pattern adapted for use with the spot-grid array pattern and the memoryless characteristic of the resist.

44 Claims, 9 Drawing Sheets

U.S. PATENT DOCUMENTS

| | | |
|---|---|---|
| 4,727,381 A | 2/1988 | Bille et al. ............... 346/108 |
| 4,950,862 A | 8/1990 | Kajikawa ............... 219/121.7 |
| 5,027,132 A | 6/1991 | Manns et al. ............ 346/108 |
| 5,085,977 A | 2/1992 | Sugawara et al. ......... 430/321 |
| 5,121,160 A | 6/1992 | Sano et al. ............... 355/53 |
| 5,148,322 A | 9/1992 | Aoyama et al. ........... 359/708 |
| 5,166,508 A | 11/1992 | Davis et al. ............ 250/201.9 |
| 5,242,803 A | 9/1993 | Noguchi .................. 355/53 |
| 5,282,088 A | 1/1994 | Davidson ................ 359/664 |
| RE34,634 E | 6/1994 | Konno et al. ............. 362/268 |
| 5,327,223 A | 7/1994 | Korth ..................... 356/359 |
| 5,345,336 A | 9/1994 | Aoyama et al. ........... 359/628 |
| 5,386,266 A | 1/1995 | Kang ..................... 355/67 |
| 5,387,961 A | 2/1995 | Kang ..................... 355/71 |
| 5,412,200 A | 5/1995 | Rhoads ................. 250/201.9 |
| 5,436,114 A | 7/1995 | Itoo et al. ................ 430/311 |
| 5,436,725 A | 7/1995 | Ledger .................. 356/357 |
| 5,452,054 A | 9/1995 | Dewa et al. .............. 355/67 |
| 5,463,200 A | 10/1995 | James et al. ........... 219/121.68 |
| 5,486,851 A | 1/1996 | Gehner et al. ............ 347/258 |
| 5,495,279 A | 2/1996 | Sandstrom ............... 347/258 |
| 5,495,280 A | 2/1996 | Gehner et al. ............ 347/258 |
| 5,517,279 A | 5/1996 | Hugle et al. .............. 355/46 |
| 5,539,568 A | 7/1996 | Lin et al. ................. 359/285 |
| 5,543,919 A | 8/1996 | Mumola .................. 356/382 |
| 5,552,820 A | 9/1996 | Genovese ................ 347/241 |
| 5,595,857 A | 1/1997 | Fukuda et al. ............ 430/311 |
| 5,631,721 A | 5/1997 | Stanton et al. ............. 355/71 |
| 5,635,976 A | 6/1997 | Thuren et al. ............ 347/253 |
| 5,659,420 A | 8/1997 | Wakai et al. .............. 359/368 |
| 5,659,429 A | 8/1997 | Kudo ..................... 359/727 |
| 5,669,800 A | 9/1997 | Ida et al. .................. 445/25 |
| 5,691,541 A | 11/1997 | Ceglio et al. ............ 250/492.1 |
| 5,700,627 A | 12/1997 | Ida et al. ................. 430/311 |
| 5,777,342 A | 7/1998 | Baer .................... 250/492.2 |
| 5,900,637 A | 5/1999 | Smith |
| 5,936,713 A | 8/1999 | Paufler et al. .............. 355/67 |
| 5,982,552 A | 11/1999 | Nakama et al. ........... 359/620 |
| 6,002,466 A | 12/1999 | Brauch et al. |
| 6,060,224 A | 5/2000 | Sweatt et al. ............. 430/395 |
| 6,061,185 A | 5/2000 | Cullman et al. ............ 355/52 |
| 6,133,986 A | 10/2000 | Johnson |
| 6,177,980 B1 | 1/2001 | Johnson .................. 355/67 |
| 6,188,519 B1 | 2/2001 | Johnson .................. 359/572 |
| 6,248,988 B1 | 6/2001 | Krantz ................. 250/201.3 |
| 6,259,550 B1 | 7/2001 | Gottfried-Gottfried et al. ..................... 359/279 |
| 6,285,488 B1 | 9/2001 | Sandstrom ............... 359/290 |
| 6,301,000 B1 | 10/2001 | Johnson .................. 355/67 |
| 6,333,508 B1 | 12/2001 | Katsap et al. ........... 250/492.2 |
| 6,335,783 B1 | 1/2002 | Kruit ..................... 355/52 |
| 6,373,619 B1 | 4/2002 | Sandstrom ............... 359/298 |
| 6,379,867 B1 | 4/2002 | Mei et al. |
| 6,392,752 B1 | 5/2002 | Johnson .................. 356/511 |
| 6,399,261 B1 | 6/2002 | Sandstrom ............... 430/30 |
| 6,424,404 B1 | 7/2002 | Johnson .................. 355/44 |
| 2002/0054284 A1 | 5/2002 | De Jager et al. ............ 355/67 |
| 2002/0163629 A1 * | 11/2002 | Switkes et al. ............. 355/53 |
| 2003/0030014 A1 | 2/2003 | Wieland et al. ......... 250/492.24 |

FOREIGN PATENT DOCUMENTS

| | | | |
|---|---|---|---|
| EP | 0759578 | 8/1996 | ............ G03F/7/20 |
| GB | 2223861 | 8/1989 | ............ G03H/1/04 |
| JP | 57181549 | 4/1981 | ............ G03F/5/14 |
| JP | 57191628 | 11/1982 | ............ G03F/27/32 |
| JP | 5818622 | 2/1983 | ............ G03F/27/52 |
| JP | 59127017 | 7/1984 | ............ G02F/27/18 |
| JP | 05224396 | 2/1992 | ............ G03F/1/08 |
| WO | WO 97/05526 | 7/1996 | ............ G03F/1/00 |
| WO | WO 97/34171 | 2/1997 | |
| WO | WO 97/34171 | 9/1997 | |
| WO | WO 98/12603 | 9/1997 | ............ G03F/7/00 |
| WO | WO 00/42618 | 1/2000 | ............ G21K/1/06 |

OTHER PUBLICATIONS

"Microlens arrays with spatial variation of the optical functions", Hessler, Th.. et al., Pure Appl. Opt. 6(1997) 673–681.

"A Microlens Direct–Write Concept for Lithography", Davidson, M., SPIE 3048, p. 346–355.

"Lithographic patterning and confocal imaging with zone plates", Gil, D. et al., J. Vac. Sci. Technol. B 18(6), Nov./Dec. 2000, pp. 2881–2885.

"Maskless, parallel patterning with zone–plate array lithography", Carter et al., J. Vac. Sci. Technol. B 17(6), Nov./Dec. 1999, pp. 3449–3552.

"Immersion lithography at 157 nm", Switkes, M. et al., J. Vac. Sci. Technol. B, vol. 19, No. 6, Nov./Dec. 2001, pp. 2353–2356.

"Liquid immersion deep–ultraviolet interferometric lithography", Hoffnagle, J. et al., Vac. Sci. Technol. B 17(6), Nov./Dec. 1999, pp. 3306–3309.

"An Overview of the Performance Envelope of Digital Micromirror Device (DMD) Based Projection Display Systems", Sampsell, J. B., Society for Information Display 1994 International Symposium (San Jose, Jun. 12–17, 1994), pp. 1–4.

"UV Thermoresists: Sub 100nm Imaging Without Proximity Effects", Gelbart, D. et al., SPIE vol. 3676, pp. 786–793.

G.J. Brakenhoff, Imaging Modes in Confocal Scanning Light Microscopy (CSLM), J. Microscopy, (1979) vol. 117, Pt. 2, pp. 233–242.

D.J.D. Carter et al., Maskless, Parallel Patterning With Zone–Plate Array Lithography, J. Vac. Sci. Technol. B, (1999), vol. 17, No. 6, pp 3449–3452.

H. Chase et al., Improvement of Spatial Light Modulators Optical Input/Output Performance Using Microlens Arrays, Optics Letters, (1995), vol. 20, No. 12, pp. 1444–1446.

Neha Choski et al., Maskless Extreme Ultraviolet Lithography, J. Vac. Sci. Technol. B, vol. 17, No. 6, 1999, pp. 3047–3051.

I.J. Cox et al., Scanning Optical Microscope Incorporating A Digital Framestore and Microcomputer, Applied Optics, 1983, vol. 22, No. 10, pp. 1474–1478.

Mark Davidson, A Microlens Direct–Write Concept for Lithography, SPIE, (1997), vol. 3048, pp. 346–354.

Martin Eisner, Transferring Resist Microlenses Into Silicon By Reactive Ion Etching, Opt. Eng., (1996), vol. 35, No. 10, pp. 2979–2982.

M. Feldman, Use of Zone Plate Arrays in Projection X–Ray Lithography, (1993), vol. 18, pp. 207.

Dan Gelbert, UV Thermoresists: Sub 100 nm Imaging Without Proximity Effects, SPIE, 1999, vol. 3676, pp. 786–793.

Dario Gil et al., Litographic Patterning and Confocal Imaging with Zone Plates, J. Vac. Sci. Technol. B, (2000), vol. 18, No. 6, pp. 2881–2885.

Edward J. Gratix et al., Fabrication of Microlenses by Laser Assisted Chemical Etching (LACE), (1991), SPIE, vol. 1544, pp. 238–243.

D.K. Hamilton et al., Three–Dimensional Surface Measurement Using the Confocal Scanning Microscope, (1981), Applied Physics B., pp. 211–213.

Hans Peter Herzig, Micro–optics, Elements, Systems and Applications, Institute of Microtechnology, University of Neuchatel, Switzerland.

Hessler et al., Microlens Arrays with Spatial Variation of the Optical Functions, Pure Appl. Opt., (1997) vol. 6, pp. 673–681.

J.A. Hoffnagle et al., Liquid Immersion Deep–Ultraviolet Interferometric Lithography, J. Vac. Sco. Technol. B, (1999) vol. 17, No. 6, pp. 3306–3309.

B.J. Kampherbeek et al., An Experimental Setup to Test the MAPPER Electron Lithography Concept, Microelectronic Eng, (2000), vol. 53, pp. 279–282.

B.J. Kampherbeek et al., Resolution of the Multiple Aperture Pixel by Pixel Enhancement of Resolution Electron Lithography Concept, J. Vac. Sci. Technol. B, (2000), vol. 18, No. 1, pp. 117–121.

P. Kruit, High Throughput Electron Lithography with the Multiple Aperture Pixel by Pixel Enhancement of Resolution Concept, J. Vac. Sci. Technol. B., (1998), vol. 16, No. 6, pp. 3177–3180.

Mark Lapedus, Startup Discloses Litho Tool for 45–nm ICs, Gets Funding From KLA–Tencor, Semiconductor Business News, Aug. 6, 2002.

Keith M. Mahoney et al., A Femtosecond Pulse–Shaping Apparatus Containing Microlens Arrays for Use with Pixellated Spatial Light Modulators, IEEE J Quantum Electronics, (1996), vol. 32, No. 12, pp. 2071–2077.

J.B. Sampsell, An Overview of the Performance Envelope of Digital Micromirror Device (DMD) Based Projection Display Systems, Society for Information Display 1994 International Symposium (San Jose, Jun. 12–17, 1994), pp. 1–4.

R. Seltmann et al., New System for Fast Submicron Optical Direct Writing, Microelectronic Engineering (1996), vol. 30, pp. 123–127.

Henry I. Smith, A Proposal for Maskless, Zone–Plate–Array Nonolithography, J. Vac. Sci. Technol. B, (1996), vol. 14, No. 6, pp. 4318–4322.

Hiroshi Suganuma et al., Deep UV Litography Using Continuous–Wave 266 nm Radiation From All Solid–State Frequency Quadrupled Nd:YAG Laser, SPIE, vol. 2440, pp. 126–135.

M. Switkes et al., Immersion Lithography at 157 nm, J. Vac. Sci. Technol. B, (2001) vol. 19, No. 6, pp. 2353–2356.

H.J. Tiziani et al., Theoretical Analysis of Confocal Microscopy with Microlenses, Applied Optics,(1996), vol. 35, No. 1, pp. 120–125.

H.J. Tiziani et al., Three–Dimensional Analysis by a Microlens–Array Confocal Arrangement, Applied Optics (1994), vol. 33, No. 4, pp. 567–572.

H.J. Tiziani et al., Confocal Principle for Macro– and Microscopic Surface and Defect Analysis, Opt. Eng., (2000), vol. 39, No. 1, pp. 32–39.

H.J. Tiziani et al., Chromatic Confocal Microsopy with Microlenses, J. Mod. Opt. (1996), vol. 43, No. 1, pp. 155–163.

H.J. Tiziani et al., Microlens Arrays for Confocal Microscopy, Opt. & Laser Technol., (1997), vol. 29, No. 2, pp. 85–91.

R. Volkel et al., Microlens Array Imaging System For Photolithography, Opt. Eng. (1996), vol. 35, No. 11, pp. 3233–3330.

R. Volkel et al., Microlens Lithography: A New Fabrication Method for Very Large Displays, Proceedings of Fifteenth International Display Research Conference, Hamamatsu, Japan, Oct. 16–18, 1995, pp. 713–716.

R. Volkel et al., Microlens Lithography: A New Fabrication Method for Very Large Displays, Proceedings from the 1995 International Conference on Micro– and Nanofabrication, Sep. 25–29, 1995.

R. Volkel et al., Microlens Lithography, (1996), Conference: 1996 Display Manufacturing Technology Conference, Digest of Technical Papers, pp. 95–96.

R. Volkel et al., Microlens Lithography: A new approach for large display fabrication, Microelectronic Eng., (1996), vol. 30, pp. 107–110.

R. Volkel et al., Microlens Lithography and Smart Mask, (1997), Microlectronic Engineering, vol. 35, pp. 513–516.

M.J. Wieland, Field Emission Photocathode Array for Multibeam Electron Lithography, Microelectronic Eng. (2001), 57–58, pp. 155–161.

The Half Moon Bay Maskless Lithography Workshop, Sponsored by DARPA and the SRC, The Half Moon Bay Lodge, The Fireside Room, Nov. 9–10, 2000.

Lithography Review, Important Developments in Microlithography, Semi Newsletter Service, (2002), vol. 4, No. 9, pp. 1–6.

International Search Report dated Aug. 20, 2003.

\* cited by examiner

OPTICAL SPOT GRID ARRAY PRINTER

CLAIM OF PRIORITY FROM PROVISIONAL APPLICATION

This application claims priority from the U.S. provisional application No. 60/331,029 filed on Nov. 7, 2001.

FIELD OF THE INVENTION

The present invention refers to a maskless method and device for patterning high-resolution images directly on photolithographic layers with a massively-parallel beam array. This device is intended for use in the fabrication of semiconductor devices, microelectronics, Microsystems, thin-film devices, flat screens, and the structuring of masks and substrates for microlithographic applications.

BACKGROUND ART

Photolithography is a technique for transferring images onto semiconductor or other substrates. There are two fundamental types of photolithography systems. A first type, referred to as image-projection lithography, uses master patterns, referred to as masks or reticles, and a projection system for projecting the image on the mask on a substrate. A second type of system, referred to as a maskless or direct-write system, forms images directly onto the substrate by scanning (or "writing") beams of light on the substrate. Maskless systems are used to generate the masks for the image-projection lithography. However, systems with masks are generally faster and better suited for high-volume commercial applications than the direct-write systems.

In image-projection lithography, an image formed on a mask is transferred to a substrate by a projection device. In one type of image-projection system, known as a wafer stepper, the entire mask pattern is projected onto the substrate at once, patterning one portion of the substrate. The mask is then moved ("stepped") relative to the substrate, and another portion of the substrate is patterned. In another type of lithographic projection apparatus, known as a step-and-scan apparatus, portions of the substrate are irradiated by progressively scanning the mask with a projection beam while synchronously scanning the substrate parallel to this direction. In both types of systems, an image is projected onto a photosensitive layer, referred to as a resist, layered on the surface of the substrate. Each mask includes a pattern corresponding to a layer of circuit components or interconnects to be formed on the substrate. A number of patterns are exposed and processed to build up the three-dimensional structure of an integrated circuit.

After exposure, the resist is developed leaving only a selected pattern of resist on the wafer corresponding to the exposed image. Since resists "resist" etching of the substrate below them, the pattern developed in the resist is transferred to the substrate by a subsequent etch step. The resist may be of a positive or negative type, which refers to the fact that the exposed resist may selectively remain on the wafer or be removed from the wafer in the development step.

Unfortunately, due to decreasing design rules and the wide use of RET (Resolution Enhancement Techniques) such as OPC (Optical Proximity Correction) and PSM (Phase Shift Masks), the masks used in image-projection systems have become increasingly difficult and expensive to make. Since many masks are needed to form the multiple patterns required to manufacture an integrated circuit, the time delay in making the masks and the expense of the masks themselves is a significant cost in the manufacture of semiconductors. This is especially so in the case of smaller volume devices, where the cost of the masks cannot be amortized over a large number of devices. Thus, it is desirable to provide a fast apparatus for making semiconductor chips while eliminating the need for expensive masks. It is also desirable to improve the obtainable resolution of optical lithography. Further, such a device may be useful for directly patterning a small number of substrates, such as runs of prototype devices, and for making masks.

A method to improve the resolution obtainable with conventional masks is described in UV thermoresists: sub-100-nm imaging without proximity effects, Gelbart, Dan, Karasyuk, Valentin A., Creo Products Inc., Proc. SPIE Vol. 3676, p. 786–793, Emerging Lithographic Technologies III, Yuli Vladimirsky; Ed. 6/1999. In this method, microlens arrays are used in combination with image-projection systems to break the image into an array of high-resolution spots that are scanned between pulses in a conventional stepper, forming a complete image. Since the spots are separated one from another, such systems eliminate optical proximity effects. With a combination of a thermal photoresist, this method provides for improved resolution with conventional masks. However, it still requires the use of a mask or reticle.

A method that eliminates the need for masks has been proposed in "A Microlens Direct-Write Concept for Lithography," Davidson, Mark, SPIE VOL. 3048, PP. 346–355, 1997 (Spectel Company, Mountain View Calif.). In this system microlens arrays have been proposed for use in direct-write systems in combination with parallel light beams for the purpose of obtaining high resolution and higher throughput. A beam splitter produces an array of parallel beams which are individually modulated by an array of piezoelectric discs in a parallel-array Michelson interferometer modulator. The modulated beams are imaged by a microlens array onto a substrate in a multi-spot grid pattern.

Another direct-write lithography employing a microlens arrays is described in "Microlens scanner for microlithography and wide-field confocal microscopy," U.S. Pat. No. 6,133,986 issued to Kenneth C. Johnson Oct. 17, 2000. In this system a parallel array of modulated beans is provided by a Digital Micromirror Device (DMD), described by J. B. Samsell in "An Overview of the Performance Envelope of Digital Micromirror Device (DMD) Based Projection Display Systems," Society for Information Display 1994 International Symposium (San Jose, Jun. 12–17, 1994). Each beam is imaged through a corresponding element in a microlens array onto a substrate in a multi-spot grid pattern.

Although both the Davidson and the Johnson systems eliminate the need for masks, they do not improve the resolution obtainable from optical based lithography. Accordingly, it is desirable to provide a practical, maskless, direct-write system with improved resolution and throughput for improved mask making and wafer lithography.

SUMMARY OF THE INVENTION

The present invention provides a high resolution and high data-rate direct-write spot grid array lithography system suitable for fast mask making and wafer lithography. According to the present invention, an image is exposed on a substrate by scanning a two-dimensional array of optical beams across the substrate. The image is formed by selectively modulating the optical beams the beam array is scanned across to the substrate. In alternative embodiments, Spatial Light Modulators provide for grey level modulation, in which intermediate level of signals, other than "on" and "off" are available. One such modulator is available from Franhaufer Institute, Dresden, Germany, and is referred to as a Cantilever Beam Micromirror Spatial Light Modulator. Another method for providing grey level modulation is described by Davidson, Mark, SPIE VOL. 3048, PP. 346–355, 1997 cited above. This method uses Michelson interferometer to generate gray level modulation. As described herein, "on" and "off" modulation is a special case of grey level modulation, in which only two gray levels, "0" and "1" are possible. Resolution is enhanced by shaping each of the selected optical beams to provide a narrowed main lobe thus defining a narrowed beam. The narrowed beams are then focused to small spots on the substrate, which is layered with a resist (also known as a photoresist). Undesired exposure resulting from side lobes of the narrowed beams is prevented by preventing the side lobes from exposing the resist with energy above its exposure threshold. This is implemented by the use of a thermal photoresist and an exposure strategy and device architecture which provide time for portions of the resist which have been exposed to side lobes to cool down before such portions might be exposed to further exposure. This exposure strategy further includes a scanning technique that provides sufficient time between exposures of adjacent points on the resist for the resist to cool between consecutive exposures.

The present invention provides lithography method comprising the steps of generating a array of substantially parallel light beams; modulating a plurality of light beams out of the array of the substantially parallel light beams corresponding to a predefined image to be recorded on a resist; shaping each light beam to provide a narrowed light beam having a narrowed main lobe and corresponding side lobes; and translating the resist relative to the array of narrowed light beams along an axis slightly rotated from the normal axis of the array such that a desired image is exposed on the resist in a staggered multiple-raster slanted scan pattern. The use of the narrowed beams provides an advantage of improved resolution.

The present invention provides lithography method and an apparatus employing a memoryless photoresist. As used herein, a memoryless thermal photoresist (or more generally, a limited response period photoresist) is characterized by the fact that it does not integrate energies of consecutive exposures, as long as none of them exceed a threshold, and there is time period (or sufficient cool-down time) between them. The class of thermal photoresists is an example of memoryless photoresists.

The present invention provides lithography method and an apparatus using a scanning and exposure strategy for supressing side lobes of the scanning beams, resulting in a significant improvement in resolution.

The present invention provides a lithography method and an apparatus using scanning techniques that provide sufficient time between exposures of adjacent points on the resist for the resist to cool between consecutive exposures. The present invention provides lithography method and an apparatus utilizing improved scanning techniques that include a high density of spots in a reduced field-of-view for improving the overall throughput of the system by reducing the time lost to scanning off-substrate areas.

The present invention provides lithography method including the step of detecting mechanical misalignments of the movable stage and providing on-the-fly correction in the direct-write optics.

The present invention provides a lithography method and an apparatus comprising a light source for providing and modulating a two-dimensional array of parallel optical beams for irradiating a substrate layered with a resist, the modulation of optical beams corresponding to a pattern to be imaged on the resist; a beam shaper interposed between the light source and the resist for narrowing each of the optical beams; focusing optics for forming a spot-grid array corresponding to a portion of the image; and a movable stage for introducing a relative movement between the resist and the focusing optics. The printer thus records a pattern on the resist resulting from an interaction of the resist with the narrowed modulated optical beams, and prevents recording resulting from an interaction of side lobes.

Advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Figure 1:
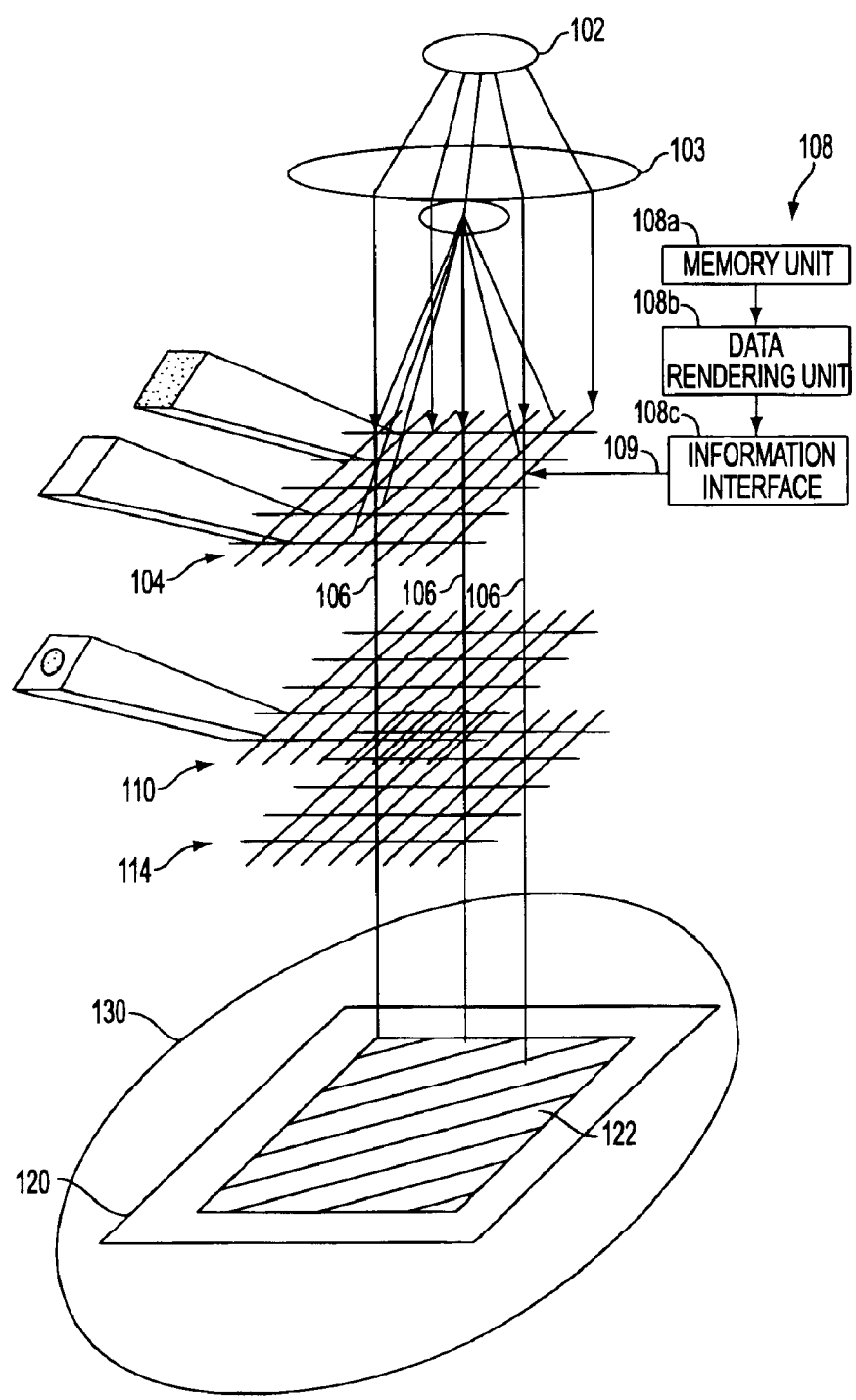
FIG. 1 is a conceptual diagram of a printer according to an embodiment of the present invention.

FIG. 1 illustrates a printer according to a first embodiment of the present invention. The printer includes a light source 102, which may be a continuous wave laser or a pulsed laser, collimating optics 103, and a spatial light modulator (SLM) 104, for providing and modulating a two-dimensional array of parallel optical beams 106. Spatial light modulator 104 modulates light beams in response to an input data signal 109 provided by programmable image generator 108 and controls the individual beams in synchronism with the control of stage 130 for exposure of a desired pattern onto substrate 120. The printer further includes a beam shaper array 110, interposed between spatial light modulator 104 and substrate 120, for narrowing each of the optical beams 106 for improved resolution. Focusing optics 114 provides a lens element for each beam 106 and focuses each beam onto a small spot on substrate 120 to form a grid-array of spaced-apart small spots on substrate 120. Substrate 120 is supported on a stage 130, which provides relative movement between the array of beams 106 and substrate 120 to form a complete image on substrate 120 as it is translated through the beams in accordance with multiple-raster slanted-scan exposure strategy.

Figure 2:
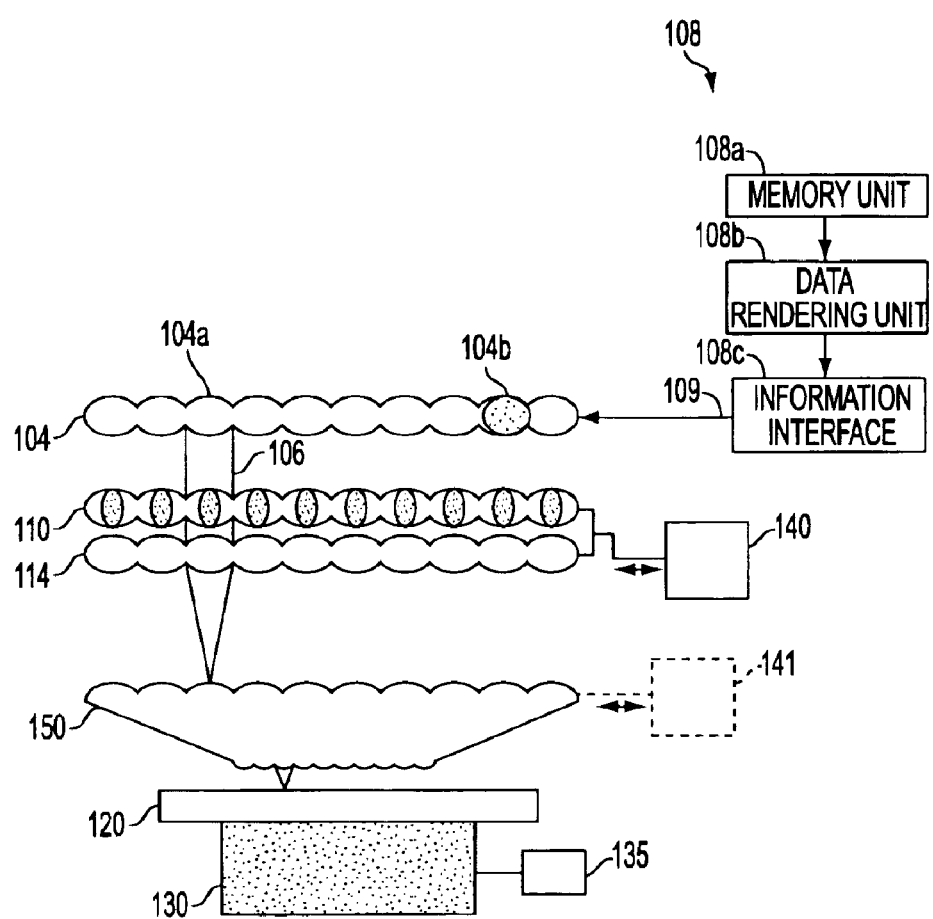
FIG. 2 schematically illustrates a printer according to another embodiment of the present invention.

In the first embodiment of the present invention, programmable Spatial Light Modulator ("SLM") 104, illustrated in both FIGS. 1 and 2, is a selectively transmissive array. An array of microshutters suitable for this function is described in "Maskless Lithography Using a Multiplexed Array of Fresnel Zone Plates," U.S. Pat. No. 5,900,637, issued to Henry I. Smith, May 4, 1999. Light incident on each element, or pixel, is selectively transmitted or blocked, corresponding to the on or off state for that pixel. Selection is accomplished in response to input data signal 109 provided by a processor 108, which includes a conventional memory unit 108a for storing compressed image information, a data rendering unit 108b for decompressing the compressed image information and formatting it according to the desired scan strategy, and an information interface 108c for converting the information to modulation signals. Each transmitted beam then continues as a beam 106 to beam shaper 110.

Figure 6A:
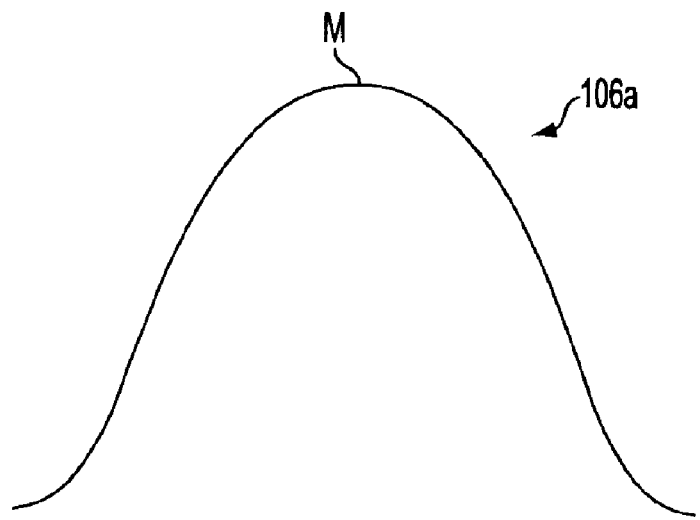
FIGS. 6a and 6b illustrate cross-sections of optical beams processed by the printer of the present invention.
Figure 6B:
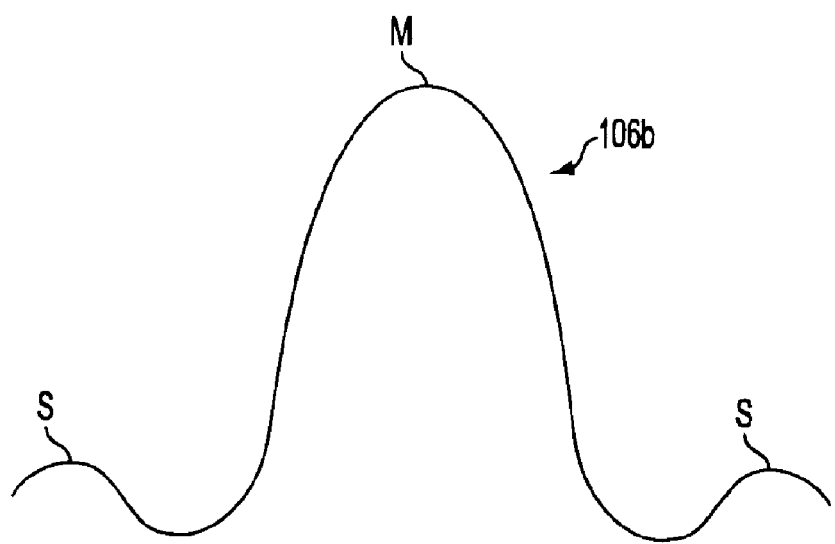

Beam shaper 110, illustrated in FIGS. 1 and 2, is positioned to receive the transmitted beams from SLM 104 and comprises an array of shaped apertures for narrowing each of the optical beams 106. Beam shaper 110 may comprise, for example, a ring aperture array. Beam shaping by the use of shaped apertures (also referred to as apodizing) shapes the amplitude profile of each beam. The present invention provides for a beam shape characterized by a main (or center) lobe that is narrower that the conventional Gaussian distribution. However, certain limitations apply to narrowing optical beams and beams cannot be arbitrarily narrowed. Generally, assuming that the beams incident on beam shaper 110 are evenly-illuminated, the cross-section of the beams exiting beam shaper 110 have an amplitude profile corresponding to the square of the Fourier transform of the shape of the aperture in beam shaper 110. As an example, an evenly-illuminated beam shaped with an aperture having a Gaussian profile, will result in a beam having negligible side lobes. Such an amplitude profile is illustrated in FIG. 6a. As a further example, an evenly-illuminated circular aperture will generate a beam referred to as an "airy pattern," having a main central lobe and side-lobes. Such an "airy pattern" beam will be characterized by a main central beam narrower than that of a Gaussian profile. An airy pattern having an amplitude profile with a narrowed main lobe (referred to as a "narrow beam" herein) and significant side lobes is illustrated in FIG. 6b. Generally speaking, any aperture weighting or "apodization" which narrows the main lobe results in increased amplitudes of the side lobes. Similarly, any aperture weighting which suppresses the side lobes tends to widen the main lobe.

Conventionally, beam shapes are chosen which minimize the amplitudes of the side lobes. In the present invention, a narrower main lobe results from ring apertures with higher weights to the aperture circumference than would be used in a Gaussian aperture. However, such a narrowed beam shape results in substantial side lobes. Improved resolution is obtained in accordance with the present invention by effectively using the narrowed beams in combination with an exposure strategy prevents the resist from being permanently affected by exposure from side lobes. As will be explained more fully below, undesired patterning from these side lobes is prevented by advantageously utilizing a thermal resist and an appropriate exposure strategy.

In an alternative embodiment of the present invention, the memoryless resist is used with a beam as illustrated in FIG. 1, without the described a beam shaper which generates a main lobe and side lobes. Rather, the same techniques are used except that instead of preventing undesired patterning from side lobes, it is the "tails" of the main lobe (as in FIG. 6a) that are prevented from causing undesired exposure. That is, the tails which are below the threshold exposure level are prevented from causing undesired permanent exposure. This allows for the use of only a central portion of the main lobe, which effectively narrows the beam. Further, since exposure to the undesired "tails" is eliminated, the process results in increased process latitude.

Referring again to FIGS. 1 and 2, the narrowed beams from beam shaper array 110 are directed to focusing optics 114. Focusing optics 114 comprise an array of microlenses which may either refractive or diffractive. For relatively low numerical apertures (NAs) and large fields of view (FOVs), plastic diffractive elements can be used. This allows for FOVs of many tens of centimeters across or even more. For high NA applications microlens arrays (typically tens of microns across) can be used. If diffractive lens elements are used, such as the Fresnel zone plate arrays described in U.S. Pat. No. 5,900,637, (referenced above) the lens array can further contain an aperture array (i.e., a pinhole array) to truncate the higher scattering orders created by the diffractive elements. Diffractive lenses are particularly suitable when used in conjunction with short wavelengths of light, such as extreme ultraviolet (EUV) of about 13 nm and are described more fully in the Smith article cited above.

Focusing optics 114 may be a single array of lenses, or multiple arrays arranged in series, as per conventional optical techniques, so the optical paths of the individual lens elements from the separate arrays form a compound lens. Such an arrangement results in arrays of compound lenses having a higher numerical aperture than can be obtained with arrays of single lenses. Such compound micro-lens arrays can be mechanically assembled by stacking individual lens arrays, or manufactured by, for example, well-known MEMS (micro-electro mechanical systems) manufacturing techniques.

As illustrated in FIG. 2, focusing optics 114 may be followed by a demagnifying lens 150, for reducing both the size of the individual spots and the overall size of the pattern (i.e. the Field-of-View) imaged on substrate 120. Such a reduction element is required in mask systems, where the mask is significantly larger than the desired final image and such reduction elements, or "stepper lenses" are typically quite expensive. However, in the embodiment of the present invention this lens may require less magnification than the 4× or 5× typical of steppers lens, or eliminated entirely, as illustrated in FIG. 1, especially if high NA elements are used in focusing optics 114.

Substrate 120 is layered with a resist 122 which is of a thermal type and irreversibly changes solubility or etch rate when a threshold temperature has been reached. Further, resist 122 is of the type that does not respond to previous partial exposures, provided that sufficient cool-down time is provided. Such thermal resists are one example of a "memoryless" resist, which refers to the fact that the resist is not affected by cumulative partial exposures. The exposure strategy and device architecture of the present invention are matched to the shape of the beams such that resist 122 does not record the side lobes of beams 106. This strategy includes:

1) Ensuring that none of the side lobes include energy sufficient to expose the resist during the scan of an individual beam; and
2) Ensuring that the time period between consecutive exposures of any portion of the resist by side lobes of consecutive beams exceeds the characteristic memory time (cool-down time) of the resist.

The exposure strategy includes the use of a staggered multiple-raster slanted-scan pattern. The narrowed optical beams in the optical beam array scan substrate 120 along adjacent but staggered scan paths such that adjacent spots on substrate 120 are exposed at different times. These time differences are selected in accordance with the exposure strategy to ensure that overlapping side lobe exposures do not permanently pattern the resist 122.

More specifically, substrate 120 is carried on mechanical stage 130, and translated in the y-direction. The array of beams 106 is slightly rotated (or "slanted") relative to the y-axis. The beam array is formed in a rectangular grid pattern in a number of rows and columns. Stage 130 is translated in the y-direction which results in each beam being scanned along a line parallel to the y-axis of the stage. The offsets of the beams across the x-axis of stage 130 is such that as substrate 120 is translated relative to the beam array in the scan direction y, the spots exposed by the beams leaves no gaps in the pattern on substrate 120. As the stage is further translated, the beams each expose spots in interlaced lines to fill in the complete image on substrate 120.

Figure 3:
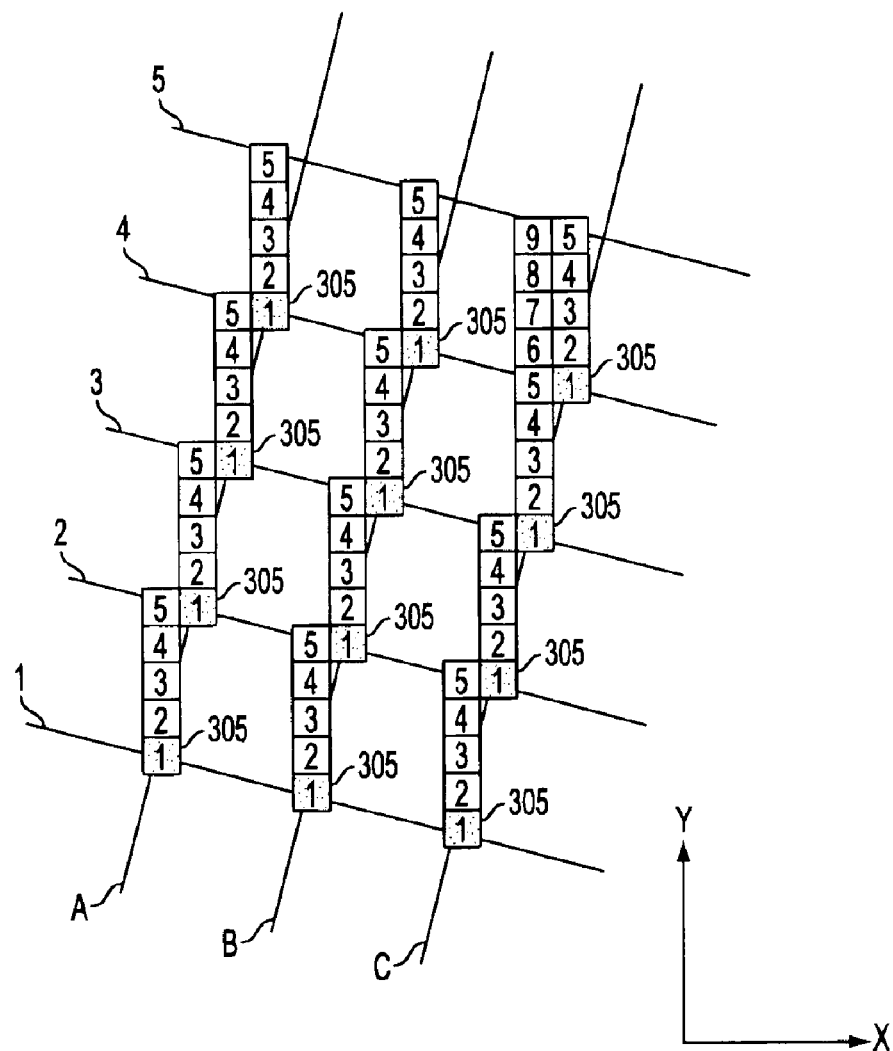
FIG. 3 illustrates a spot-grid array pattern formed on substrate 130 in accordance with a first scanning technique.

FIG. 3 depicts a spot-grid array pattern formed on substrate 130 in accordance with a first scanning technique. A spot array 305 comprising the darkened spots in FIG. 3 is patterned on substrate 120 by beam array 106. For simplicity, FIG. 3 shows a only a portion of spot array 305 focused on substrate 120, which preferably would include hundreds or thousands of elements. In FIG. 3, a pattern corresponding to a 3×4 beam array is illustrated. The array includes 3 vertical columns (A, B and C) and four horizontal rows (1, 2, 3, and 4). Each beam is identified by its column and row position. For example, the beam array includes beams A1, B1, C1, A2, B2, C2, etc, where A1 refers to the beam in column A, row 1. The initial positions of the beams are designated as circular numbered spots. The initial spots, designated with the numbers "1," are darkened. The beam array is slanted relative to the y-axis, as can be seen by the orientation of the darkened spots relative to the designated y-axis, which corresponds the axis along which the beam array is translated relative to substrate 120 by stage 130. The beam array is slanted relative to the y-axis such that spot B1 is positioned one pixel-width past spot A1 in the y-direction and such that spot B1 is displaced one pixel-width from the last beam in column A (beam A4) in the x-direction. One exposure is made, exposing the spots in the initial position (positions "1"). These positions will be designated with the subscript 1. That is, the spot grid array exposed in a first exposure includes spots A11, B11, C11, A21, B21, and C21 etc. Stage 130 is then moved in the y-direction by stage 130 so that the beams expose positions translated one pixel-width along the y-axis and a second exposure is made. This second exposure will expose a grid array including spots A12, B12, C12, A22, B22, and C22 etc. As can be readily appreciated, since there is one beam associated with each vertical column along the y-axis, a complete image can be exposed as the beam array is translated along the y-axis by using this slanted-scan exposure technique. Further, as can be seen, adjacent positions on substrate 120 are not simultaneously exposed, which makes this exposure technique suitable for use with memoryless resists and narrowed beams characterized by side lobes.

Figure 4B:
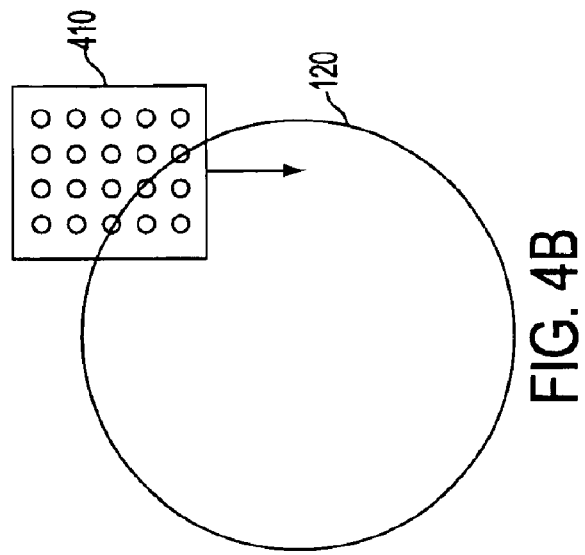
FIG. 4B illustrates the FOV of a spot-grid array relative to a substrate.
Figure 4A:
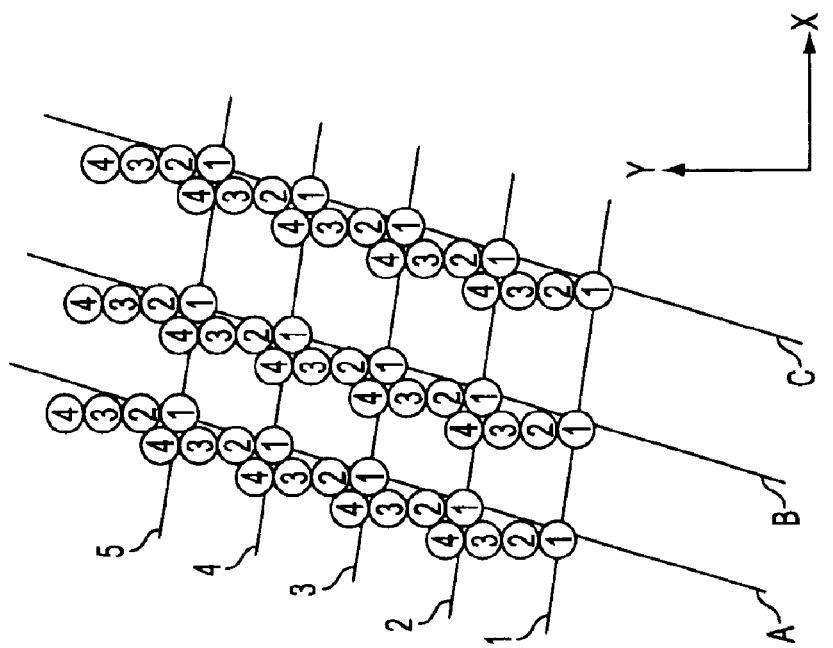
FIG. 4A illustrates a spot-grid array pattern formed on substrate 130 in accordance with a second scanning technique.

A second interlaced scanning technique is illustrated in FIG. 4A. In this second slanted-scan technique, a pattern corresponding to a 3×5 beam array is illustrated. The beam array includes 3 columns (A, B and C) and five rows (1, 2, 3, 4 and 5). Each beam is identified by it column and row position. For example, the beam array in its initial position includes beams A1, B1, C1, A2, B2, C2, etc. The beam array is slanted relative to the y-axis, which is the axis along which the beam array is translated relative to substrate 120 by stage 130. The beam array is slanted relative to the y-axis such that spot Al is positioned one/half pixel-width past spot B1 in the y-direction and such that the first beam on column B (beam B1) is displaced one/half pixel-width from the last beam in column A (beam A5) in the x-direction. One exposure is made, exposing the spots in the initial position, which will again be designated with the subscript 1. That is, one spot grid array including spots A11, B11, C11, A21, B21, and C21 etc. are exposed in a first exposure. Stage 130 is then moved in the y-direction by stage 130 so that the beams expose positions translated one pixel-width along the y-axis and a second exposure is made. This second exposure will expose a grid array including A12, B12, C12, A22, B22, and C22 etc. As can be readily appreciated, since the vertical rows of the final pattern on substrate 120 are offset by one-half pixel width from their nearest neighbor and each row in the final pattern is also offset by one-half a pattern from its nearest neighbor, a tightly packed pattern results. Further, as can be seen, adjacent positions on substrate 120 are not simultaneously exposed, which makes this exposure technique suitable for use with memoryless resists and narrowed beams characterized by side lobes.

Either a continuous light source or a pulsed light source may be used for these scanning techniques. However, if a continuous light source is used it is possible that the resist may not cool down sufficiently between exposure of consecutive pixels formed by each beam and illumination from side lobes may accumulate, resulting in a loss of resolution in the y direction. To avoid this loss of resolution, SLM 104 may be used to blank the beams between two consecutive pixels.

One consideration of using large spot-grid arrays is that of field-of view (FOV). In particular, in the simple slanted-scan technique illustrated in FIG. 3, a large number of beams would result in a relatively large field-of-view. A large number of beams is required to obtain fast writing speeds a high resolution. However, large fields-of-view have a number of disadvantages. First, a large field-of-view is disadvantageous in semiconductor lithography because semiconductor substrates are not typically flat. This will result in focusing problems on substrate 120. Another problem related to large fields-of-view arises from the problem of forming a complete scan image of the edges of the substrate. FIG. 4B illustrates the FOV of a spot-grid array according to the present invention relative to a substrate. As can be appreciated from inspection of FIG. 4B, spot-grid array 410 must be scanned from a position completely off the substrate on one side to a position completely off the substrate on the other side in order to from a complete image on the substrate. During the initial and terminal portions of the scan not all of the beams illuminate the substrate. The requirement for overlap makes the stage larger and more cumbersome than desired and increases the time to expose a substrate. Accordingly, it is desired to reduce the size of the FOV 140 of the beam array. However, since the writing time is a function of the number of beams in the beam array, it is further desired to reduce the size of the FOV without reducing the number of beams in the beam array, requiring a greater density of beams in the beam array.

Increasing the density of the beam array requires decreasing the pitch ("P"), the cross-scan distance between the beams. However, to create a complete but non-overlapping traces on substrate 120 with a slanted scan, it is necessary that distance between adjacent scan lines ("d") equal the product of the pitch ("P") and N, where N is the number of beams is a column.

$$d=P*N$$

To reduce the spacing between adjacent scan lines further would result in overwriting of the spots of one beam by another unless a different scanning technique is implemented. One embodiment of the present invention includes such a technique, which is referred to as interleaving. A number of interleaving techniques exist, corresponding to integer numbers (I) greater than 1.

Figure 5A:
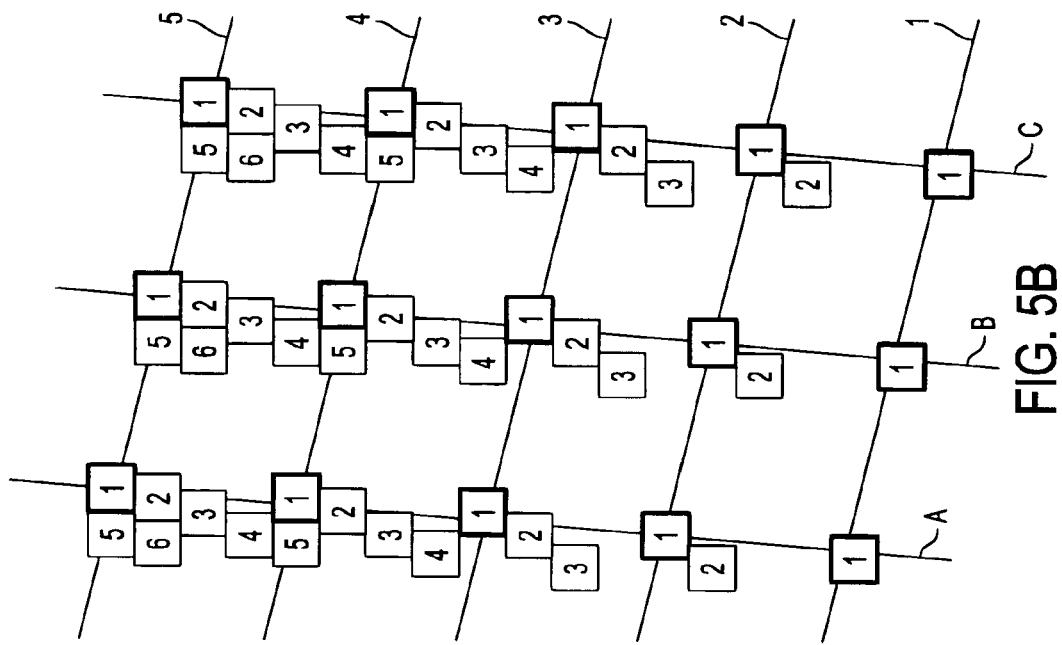
FIG. 5A illustrates a spot-grid array pattern formed on substrate 130 in accordance with a first interleaved scanning technique.

A first interleaved exposure pattern (corresponding to I=2) is illustrated in FIG. 5A. A pattern corresponding to a 3×6 beam array is illustrated. As illustrated, beams do not expose adjacent spots along the y-axis on substrate 120. The beam array includes 3 columns (A, B and C) and six rows (1–6). Each beam is identified by it column and row position. For example, the beam array in its initial position includes beams A1, B1, C1, A2 B2, C2, etc. The beam array is slanted relative to the y-axis, which is the axis along which the beam array is translated relative to substrate 120 by stage 130. The beam array is slanted relative to the y-axis such that spot A1 is positioned one/half pixel-width past spot B1 in the y-direction and such that the first beam on column B (beam B1) is displaced one/half pixel-width from the last beam in column A (beam A6) in the x-direction. One exposure is made, exposing the spots in the initial position, which will again be designated with the subscript 1. That is, one spot grid array including spots A11, B11, C11, A21, B21, and C21 etc. are exposed in a first exposure. Stage 130 is then moved in the y-direction by stage 130. However, unlike the previous examples, in this interleaved technique, stage moves such that the beams expose positions translated an integer I (other than one) number of pixel-widths along the y-axis. In the illustrated example the integer I has been chosen as 2 for simplicity in illustration and explanation. A second exposure is now made. This second exposure will expose a grid array including A12, B12, C12, A22, B22, and C22 etc. As can be readily appreciated, since the vertical rows of the final pattern on substrate 120 are offset by one-half pixel width from their nearest neighbor and each row in the final pattern is also offset by one-half a pattern from its nearest neighbor, a tightly packed pattern results. Further, as can be seen, adjacent positions on substrate 120 are not simultaneously exposed, which makes this exposure technique suitable for use with memoryless resists and narrowed beams characterized by side lobes. Further still, the interleaved configuration allows for the packing of more beams into a smaller field of view.

Figure 5B:
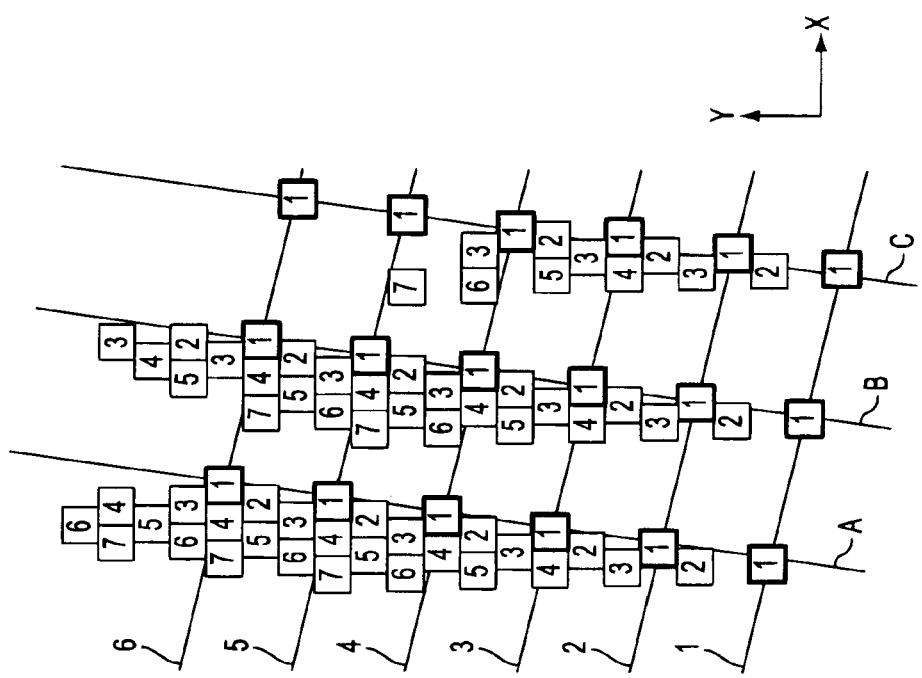
FIG. 5B illustrates a spot-grid array pattern formed on substrate 130 in accordance with a second interleaved scanning technique.

A second interleaved exposure pattern (corresponding to I=3) is illustrated in FIG. 5B. A pattern corresponding to a 3×5 beam array is illustrated. As illustrated, beams do not expose adjacent spots along the y-axis on substrate 120. The beam array includes 3 columns (A, B and C) and five rows (1–5). Each beam is identified by it column and row position. For example, the beam array in its initial position includes beams A1, B1, C1, A2 B2, C2, etc. The beam array is slanted relative to the y-axis, which is the axis along which the beam array is translated relative to substrate 120 by stage 130. The beam array is slanted relative to the y-axis such that spot A1 is positioned one/third pixel-width past spot B1 in the y-direction and such that the first beam on column B (beam B1) is displaced one/third pixel-width from the last beam in column A in the x-direction. As can be seen, a 9×9 beam array would be required to proved a complete scan, so the last beam in column A would be A9. One exposure is made, exposing the spots in the initial position, which will again be designated with the subscript 1. That is, one spot grid array including spots A11, B11, C11, A21, B21, and C21 etc. are exposed in a first exposure. Stage 130 is then moved in the y-direction by stage 130. However, in the interleaved technique for I=3, stage 130 moves such that the beams expose positions translated three (I=3) pixel-widths along the y-axis. A second exposure is now made. This second exposure will expose a grid array including A12, B12, C12, A22, B22, and C22 etc. As can be readily appreciated, since the vertical rows of the final pattern on substrate 120 are offset by one-third pixel width from their nearest neighbor and each row in the final pattern is also offset by one-third a pattern from its nearest neighbor, a tightly packed pattern results. Further, as can be seen, adjacent positions on substrate 120 are not simultaneously exposed, which makes this exposure technique suitable for use with memoryless resists and narrowed beams characterized by side lobes. Further still, the interleaved configuration allows for the packing of more beams into a smaller field of view.

Other interleaved techniques can be constructed. For example, in a case characterized by I=4, the stage is translated 4 pixel widths each exposure and the beams are aligned along vertical columns spaced one-fourth of a pixel width apart. In the general case, the beam array is tilted such that the x-axis separation between the paths of lens in consecutive rows is only a fraction (1/I) of the pixel width (p). For example, referring to FIG. 5A (I=2), spot A21 is displaced along the x-axis from spot A11 by p/2. The stage velocity is chosen such that each spot transverses a distance in the y-axis a factor of (p*I) between each exposure. That is, spot A12 is displaced along the y-axis by a distance p*2 from spot A11. Finally, it can be seen that the array size to provide a complete scan is a factor of the pixel width (p), the interleave factor (I), and the distance between beams (d). Simply, each column will fill the pattern between consecutive beams in a given row. Thus, d=N*p/I, where N is the number of beams in a column.

As can be readily appreciated from comparing of FIGS. 3 and 5B, the second interleaved scanning technique (I=3) reduces the pitch P by a factor of three as compared to the beam array 305 illustrated in FIG. 3. Since d=N*p/I, the spacing between beams can be reduced by a factor of three, allowing a denser array of beams in a given field-of-view. In fact, a FOV that contains an equal number of beams would be nine times smaller, than the FOV 305.

In general, in interleaved patterns it is preferable that the light source is a pulsed laser source (such as an Excimer laser or Q laser) or that the SLM be capable of high speed switching so that the beams can be quickly blanked between sequent exposures and blurring does not occur between spots as the stage is repositioned. Alternatively, SLM 104 can appropriately blank all beams.

Figure 5C:
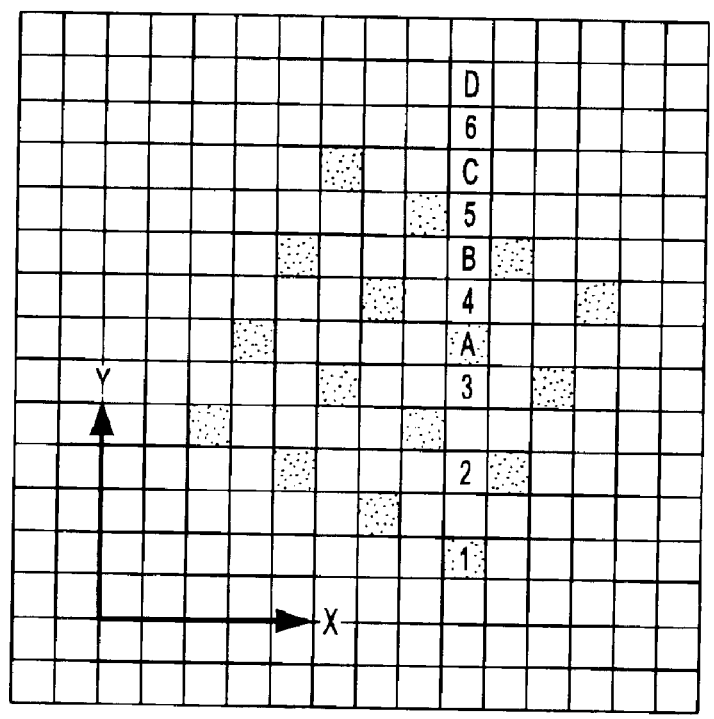
FIG. 5C illustrates a spot-grid array pattern formed on the substrate in accordance with one other interleaved scanning technique.

One other interleave pattern is illustrated in FIG. 5C. FIG. 5C depicts a spot-grid array pattern formed on the substrate. A spot array comprising the darkened spots in FIG. 5C is patterned on the substrate by the beam array. For simplicity, FIG. 5C shows a 4×4 spot array focused on the substrate. This array is similar to the one illustrated in FIG. 3 with the following differences. First, the overall size of this array is reduced by a factor of 2, by using, for example, optical de-magnification. This is done to obtain a narrower field of view. Second, the beam array is slanted relative to the y-axis by twice the rotation shown in FIG. 3, such that there are two spots on each column aligned along the y-axis. The scanning technique is as follows. One exposure is made exposing the spots in the initial position. (darkened positions). The stage is then moved in the y-direction at a linear velocity that is twice the velocity associated with FIG. 3. This maintains the same pixel rate as that of FIG. 3 but in a the smaller field of view. The scanning technique is described in more detail along one column as follows. In the first exposure, pixels "1" and "A" are exposed. The stage is then moved, and pixels "2" and "B" are exposed. In the third exposure, pixels "3" and "C" are exposed, etc. As can be readily appreciated, the whole writing area is thus covered using a narrower field of view while maintaining the same writing rate and resolution. Although a 4×4 array has been described for simplicity, in practice a larger array, such as a 1000×1000 array would be used. In such a larger array, the amount that the array would be roated from the axis of the stage would be rotation be correspondingly smaller.

Figure 7:
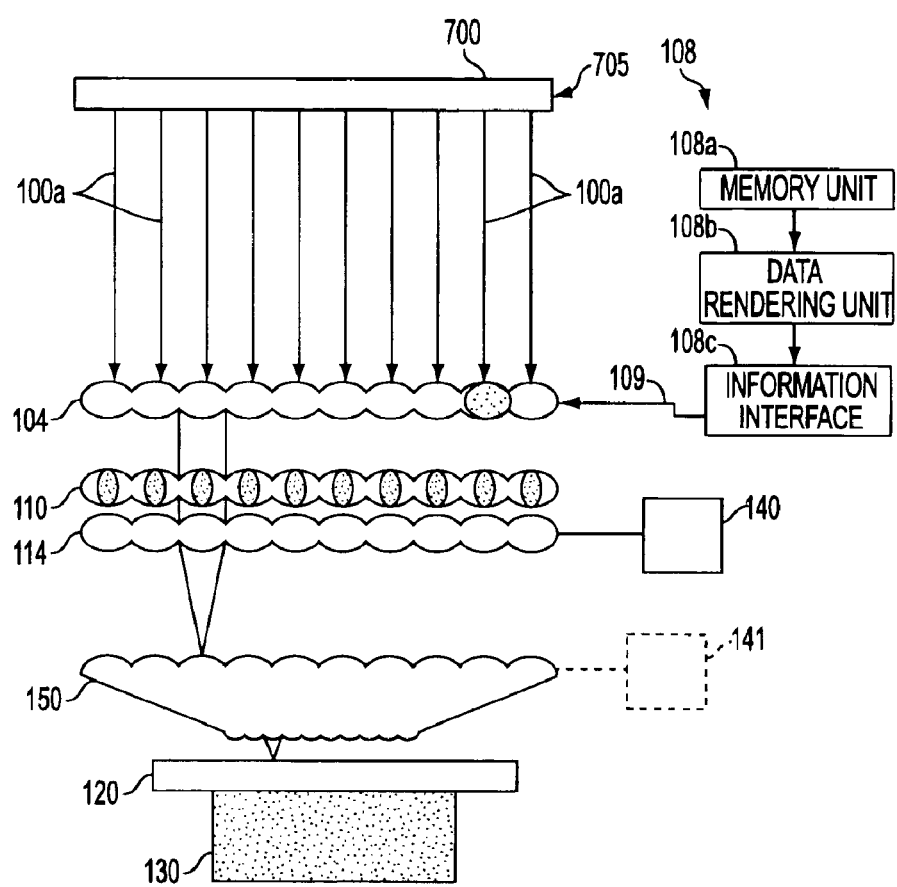
FIG. 7 schematically illustrates a printer having an according to an embodiment of the present invention.

In an alternative embodiment of the present invention, illustrated in FIG. 7, an array of individually controlled lasers 700 is used as a light source to create a spot array on SLM 104. Laser array 700 can comprise an array of vertical cavity surface emitting lasers (VCSELs), available from Band Gap Engineering of Colorado. VCSELs are semiconductor lasers that emit light from the top of the chip, straight up. The use of individually controlled lasers would further permit the modulation of the individual beam amplitudes in response to an amplitude control signal 705.

Figure 8:
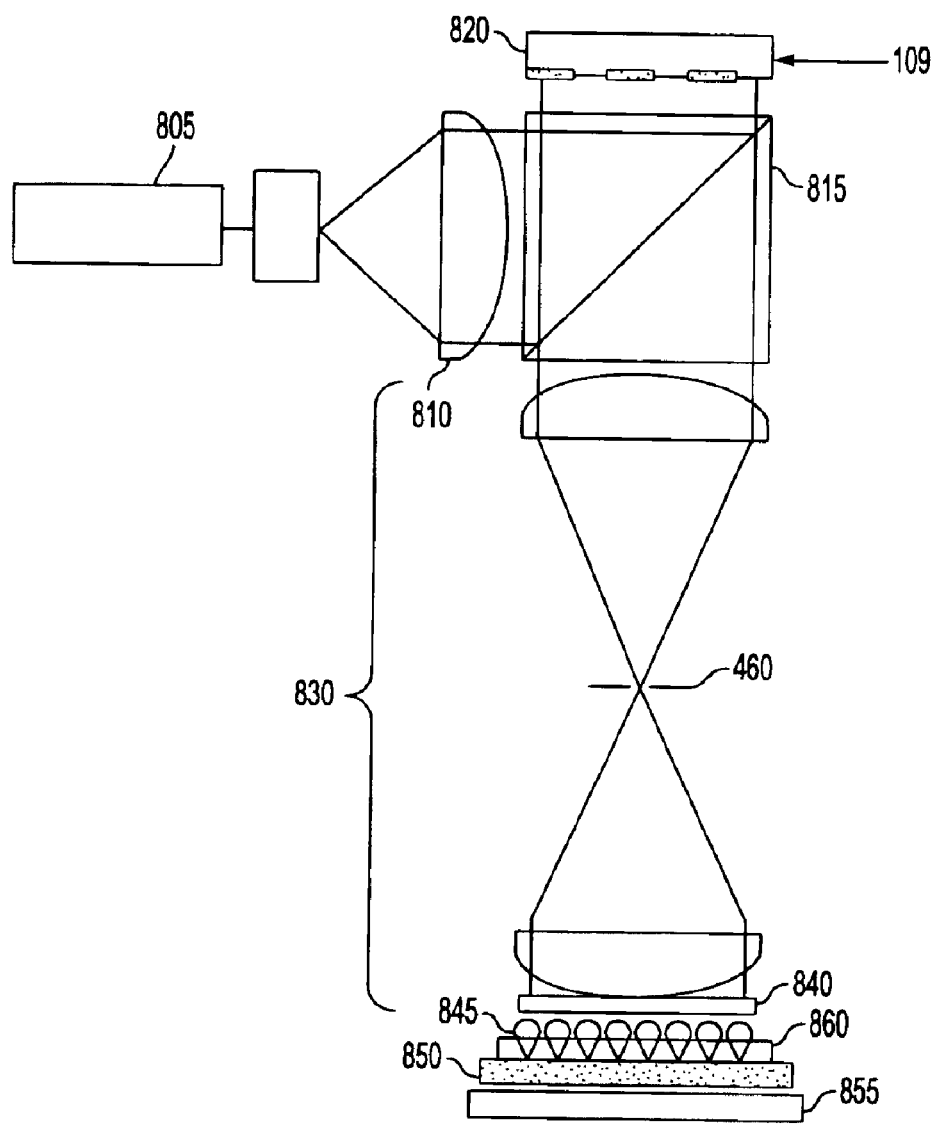
FIG. 8 schematically illustrates a printer having an according to an embodiment of the present invention.

An alternative configuration for the present invention is illustrated in FIG. 8. In this embodiment, light source 805 comprises a pulsed laser light source. The laser light is collimated by lens 810 and reflected from half-silvered mirror 815 onto a 1 k by 1 k pixel reflective spatial light modulator 820. Reflective spatial light modulator 820 comprises an array of micromirrors, such as a Model DMD available from Texas Instruments of Dallas, Tex. Light from each SLM element (also called a pixel) in the "on" state are focused and re-collimated by optical system 830 onto a corresponding element of beam shaper 840. An aperture stop 460 is placed at the focus of optical system 830 so as to block light from the SLM elements in "off" states that are deflected. A further advantage of using the optical system 830 and aperture 460 is the reduction in stray light and a subsequent improvement in the signal-to-noise in the system. Light from SLM elements in "on" states passes through aperture stop 460. Microlens array 845 focuses the selected narrowed beams from beam shaper 410 onto resist 850, which is placed upon movable stage 855.

Movable stage 855 must be capable of providing accurate linear motion, such as can be obtained from a conventional interferometer-controlled stage with linear motors, commercially available from Anorad Corporation of New York.

To correct for any residual inaccuracy such as that created by mechanical vibrations of the stage, a compensator for compensating for inaccuracies in the stage's movement is introduced. Referring to FIG. 2, an interferometer device 135, which is either part of the stage or an additional component, is coupled to stage to detect its position and to allow for the generation of a position error signal. These errors can be compensated by a number of alternatives. First, a compensator 140 can be coupled to beam shaper 110 and focusing optics 114 to move them by an amount sufficient to compensate for stage position. Second, a compensator 141 can be coupled to demagnifier 150 to move it by an amount to compensate for the stage position error. Third, a compensator could be coupled to a movable mirror for varying the angle of incidence of the light source onto one of the optical elements of the printer, so as to compensate for the stage position error. For example, if the optical path was folded by 90 degrees between beam shaper 110 and focusing optics 114, and a movable 2-axes mirror was positioned to direct light from beam shaper 110 to focusing optics 114, changing the angle of the mirror would vary the angle of incidence of the light on focusing optics 114, resulting in a translation of the focused image.

According to one embodiment of the present invention shown in FIG. 8, the printer includes a high index fluid 860, to fill the gap between focusing optics 860 and substrate 850. This effectively shortens the wavelength of the light so that the numerical aperture is increased. As a result, a better optical resolution is achieved. Suitable fluids are discussed in the literature, including Liquid Immersion deep-ultraviolet interferometric lithography, Hoffnage et al, J. Vac. Sci. Technol. B 17(6), November/December 1999 and Immersion Lithography at 157 nm, Switkes and Rothschild, J. Vac. Sci. Technol. B, Vol. 19, No. 6, November/December 2001. Presently, immersion techniques are used in microscopy in the biological fields, however the technique is not currently used in commercial lithography. However, the present invention is suitable for use with immersion for two reasons. First, the present invention, especially when implemented with massive numbers of parallel beams, is characterized by slow scan speeds, which makes it suitable for use with an immersion fluid. Second, embodiments that do not use a demagnifier lens and have the focusing optics proximate to the substrate, such as shown in FIGS. 1 and 8, wherein a substantially flat microlens array is positioned close to the substrate, are compatible with the use of an immersion fluid as they would better retain the fluid and would require a smaller volume. Further advantages of using an immersion fluid is that it will reduce contamination caused by outgassing.

To obtain good results when practicing the spot array concept of the present invention, close tolerances on the linearity of the optics is important—both for the focusing optics 114 and for the de-magnification optical elements 150. The optical spots 107 must be located on an exactly rectilinear grid with very exact distances between the spots. For example, in a grid 1000 rows deep, the thousandth row spot of column n must pass accurately near the location which was viewed by the first row's spot of column n−1. Assuming a desired accuracy of 1/10th of a pixel, this implies linearity of one tenth of a pixel over the length of the FOV. Where the lens pitch is equal to 100 pixels, the linearity requirement is therefore 1:10E6 (1000 rows *100 pixels pitch/0.1 pixel tolerance=10E6). This requirement for extreme accuracy is problematic if mechanical vibrations are present.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention may be practiced without resorting to the details specifically set forth. In other instances, well known processing structures have not been described in detail, in order not to unnecessarily obscure the present invention.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A printer adapted for use with a substrate layered with a memoryless resist, the printer comprising:
   a programmable optical radiation source for providing an array of substantially parallel optical beams, the optical beams individually modulated in response to an input signal;
   a beam shaper for narrowing the optical beams;
   focusing optics positioned to receive the narrowed modulated optical beams and for focusing the narrowed modulated optical beams;
   a movable stage for introducing a linear movement between the substrate and the focused narrowed modulated optical beams, the translation providing for a slanted scan;
   a detector coupled to the stage for detecting positional errors; and
   a compensator for varying the path of the optical beams to compensate for positional errors.

2. The printer of claim 1, wherein the programmable optical radiation source provides a sequence of modulated optical beam arrays, each corresponding to an intermediate pattern on the substrate, and the superposition of the intermediate patterns forms a final image on the substrate.

3. The printer of claim 1 wherein the light source comprises an array of lasers.

4. The printer of claim 1, wherein the light source is a continuous light source.

5. The printer of claim 1, wherein the light source is a pulsed light source.

6. The printer of claim 1, wherein the focusing optics comprises a microlens array, with one lens element corresponding to each individual light beam.

7. The printer of claim 6, wherein the micro-lenses are diffractive.

8. The printer of claim 1, wherein the array of light beams is two-dimensional.

9. The printer of claim 1, wherein as the substrate is moved a distance substantially equal to a length of the array in the scanning direction, the optical beams trace a substantially continuous path on the substrate surface in a mechanical cross-scan direction.

10. The printer of claim 9, wherein the movable stage is for moving the substrate such that the optical beams overlap by integer fractions of a pixel width as they trace the continuous path on the substrate.

11. The printer of claim 1, wherein the compensator is selected from the group consisting of a movable mirror, an electro-optic element and an acousto-optic element for varying an angle of incidence of the optical beams onto the surface of the substrate for compensating for positional errors.

12. The printer of claim 11, comprising a servo for moving the focusing optics to compensate for positional errors inaccuracies in the movement of the stage.

13. The printer of claim 1, adapted for use with a fluid having a substantially optimized refractive index disposed in and filling a gap between the substrate and the focusing optics.

14. The printer of claim 6, wherein the beam shaper comprises a member having an array of ring apertures corresponding to the lenses of the micro-lens array.

15. The printer of claim 1, wherein the beam shaper generates a beam having a main lobe and at least one side lobe, wherein the side lobes have an amplitude and side lobes have an amplitude and a radius such that the resist is not permanently exposed by a single exposure to a side lobe.

16. The printer of claim 15, wherein the stage is for moving the substrate relative to the beam shaper such that a time period that exceeds a response period of the resist elapses between a plurality of consecutive irradiations of a single area of the substrate by the side lobes.

17. A printer adapted for use with a substrate layered with a memoryless resist, the printer comprising:
   a programmable optical radiation source for providing an array of substantially parallel optical beams, the optical beams individually modulated in response to an input signal;
   a beam shaper for narrowing the optical beams;
   focusing optics positioned to receive the narrowed modulated optical beams and for focusing the narrowed modulated optical beams;
   a movable stage for introducing a linear movement between the substrate and the focused narrowed modulated optical beams, the translation providing for a slanted scan; and
   a demagnifier positioned between the focusing optics and the substrate for demagnifying the pattern of focused narrowed modulated optical beams.

18. The printer of claim 17, further comprising a detector coupled to the stage for detecting positional errors and a compensator for moving the demagnifier to compensate for positional errors.

19. A printer adapted for use with a substrate layered with a memoryless resist, the printer comprising:
   a programmable optical radiation source for providing an array of substantially parallel optical beams, the optical beams individually modulated in response to an input signal;
   a beam shaper for narrowing the optical beams;
   focusing optics positioned to receive the narrowed modulated optical beams and for focusing the narrowed modulated optical beams; and
   a movable stage for introducing a linear movement between the substrate and the focused narrowed modulated optical beams, the translation providing for a slanted scan;
   wherein as the substrate is moved a distance substantially equal to a length of the array in the scanning direction, the optical beams trace a substantially continuous path on the substrate surface in a mechanical cross-scan direction;
   wherein the movable stage is for moving the substrate such that the optical beams overlap by integer fractions of a pixel width as they trace the continuous path on the substrate; and wherein the programmable optical radiation source periodically blanks the optical beams when the stage is moving the substrate such that an interleaved scan pattern is formed on substrate.

20. Apparatus for exposing a substrate to a light image comprising:

a programmable light source for providing and modulating a plurality of substantially parallel optical beams, the optical beams modulated in response to an input data signal;

a beam shaper for narrowing the beams such that the beams comprise a central main lobe and at least one side lobe;

a movable stage for scanning the substrate through the narrowed array of beams in a direction slanted relative to the axes of the beam array;

a detector coupled to the stage for detecting positional errors; and a compensator for varying the path of the optical beams to compensate for positional errors.

21. Apparatus for exposing a substrate to a light image comprising:

a programmable light source for providing and modulating a plurality of substantially parallel optical beams, the optical beams modulated in response to an input data signal;

focusing optics positioned to received the optical beams for focusing the optical beams to form a spot-grid array pattern;

a movable stage for scanning the substrate through the focused narrowed array of beams;

a detector coupled to the stage for detecting positional errors; and a compensator for varying the path of the optical beams to compensate for postional errors.

22. Apparatus as in claim 21 wherein the movable stage for scanning the substrate through the narrowed array of beams scans in a direction slanted relative to the axes of the beam array.

23. Apparatus as in claim 22 further comprising a beam shaper for narrowing the beams such that the beams comprise a central main lobe and at least one side.

24. A method comprising the steps of:

applying a memoryless resist to substrate;

generating an array of substantially parallel light beams;

modulating a plurality of the light beams of the array for irradiating a substrate, the light beams modulated in response to an input signal corresponding to a predefined image to be recorded on the substrate;

moving the substrate on a movable stage in a direction slanted relative to the axes of the beam array while the generating, modulating steps are performed, such that the predefined image is recorded on the substrate;

detecting positional errors of the movable stage; and compensating for the positional errors in the movable stage.

25. The method of claim 24 wherein the optical beams overlap by integer fractions of a pixel width as they trace a continuous path on the substrate.

26. The method of claim 24, comprising focusing the modulated light beams with an array of lenses after the modulating step.

27. The method of claim 24, comprising providing a fluid having a substantially optimized refractive index disposed in and filling a gap between the array of lenses and the substrate.

28. The method of claim 24, comprising moving the substrate substantially linearly in a scanning direction that deviates from an axis of the light beam array such that as the substrate is moved a distance substantially equal to a length of the array in the scanning direction, the modulated light beams trace a substantially continuous path on the substrate surface in a mechanical cross-scan direction.

29. A method comprising the steps of:

applying a memoryless resist to a substrate;

generating an array of substantially parallel light beams;

modulating a plurality of the light beams of the array for irradiating a substrate, the light beams modulated in response to an input signal corresponding to a predefined image to be recorded on the substrate;

moving the substrate on a movable stage in a direction slanted relative to the axes of the beam array while the generating, modulating steps are performed, such that the predefined image is recorded on the substrate;

wherein the optical beams overlap by integer fractions of a pixel width as they trace a continuous path on the substrate;

the method further comprising the step of periodically blanking the optical beams when the stage is moving the substrate such that an interleaved scan pattern is formed on substrate.

30. A printer for exposing a substrate comprising:

a programmable light source for providing and modulating a plurality of substantially parallel optical beams in response to an input data signal;

a movable stage for scanning the substrate through the optical beams;

a detector coupled to the stage for detecting positional errors; and a compensator for varying the path of the optical beams to compensate for positional errors.

31. A printer as in claim 30 further comprising focusing optics for individually focusing the optical beams on a common image plane to form a spot-grid array pattern.

32. A printer as in claim 31 wherein the array is two dimensional.

33. Apparatus as in claim 32 wherein the movable stage for scanning the substrate through the array of beams scans in a direction slanted relative to the axes of the beam array.

34. Apparatus as in claim 33 further comprising a beam shaper for narrowing the optical beams and generating a main lobe and a corresponding side lobe for each beam.

35. A device for exposing a lithographic material, the lithographic material having the characteristic of being substantially memoryless after a predetermined period of time, the device comprising:

a light source;

a programmable two-dimensional spatial light modulator positioned to receive light from the light source for providing a parallel array of modulated light beams, the light beams modulated in response to an input data pattern signal;

a beam shaper array, with an element corresponding to each beam, for narrowing the optical beams, the narrowed optical beams characterized by a strong main lobe and lesser side lobes;

a focusing array, with an element corresponding to each beam, for focusing the narrowed modulated optical beams to form a spot array; and a movable stage for introducing a relative movement between the lithographic material and the focusing optics such that the following conditions are meet:
 a) the exposure time of imaged main lobes is sufficient to expose the lithographic material;
 b) the exposure time of the imaged side lobes is not sufficient to individually expose the lithographic material; and
 c) adjacent positions of the lithographic material are not exposed within the predetermined time period characterizing the lithographic material.

36. A device for exposing a lithographic material, the lithographic material having the characteristic of being substantially memoryless after a predetermined period of time, the device comprising:
 an optical radiation source for providing an array of imaging beams and for modulating the optical beams in a sequence of desired patterns, the sequence of desired patterns corresponding to an image to be recorded on the lithographic material;
 a beam shaper array, with an element corresponding to each beam, for narrowing each modulated optical beam, the narrowed optical beams characterized by a strong main lobe and lesser side lobes;
 a focusing array, with an element corresponding to each beam, for focusing the narrowed modulated optical beams onto the lithographic material;
 a movable stage for introducing a relative movement between the lithographic material and the beam shaper array such that the following conditions are meet:
 a) the exposure time of imaged main lobes is sufficient to expose the lithographic material;
 b) the exposure time of the imaged side lobes is not sufficient to expose the lithographic material;
 c) adjacent positions of the lithographic material are not exposed within the predetermined time period characterizing the lithographic material; and
 d) closest parallel scan lines are spaced apart by an integer fraction (px/n) of the pixel width, and sequential pixels exposed by a beam are spaced apart by an integer multiple of the pixel width (px*n).

37. A printer adapted for use with a substrate layered with a memoryless resist, the printer comprising:
 a programmable optical radiation source for providing an array of substantially parallel optical beams, the optical beams individually modulated in response to the input signal;
 focusing optics positioned to receive the modulated optical beams and for focusing the modulated optical beams;
 a movable stage for introducing a linear movement between the substrate and the focused modulated optical beams, the translation providing for a slanted scan;
 a detector coupled to the stage for detecting positional errors; and
 a compensator for varying the path of the optical beams to compensate for positional errors.

38. The printer of claim 37, wherein the programmable optical radiation source provides a sequence of modulated optical beam arrays, each corresponding to an intermediate pattern on the substrate, and the superposition of the intermediate patterns forms a final image on the substrate.

39. The printer of claim 37 wherein the programmable optical radiation source comprises a light source and a spatial light modulator.

40. The printer of claim 38, wherein the light source comprises a pulsed light source.

41. A printer adapted for use with a substrate layered with a memoryless resist, the printer comprising:
 an optical radiation source for providing an array of substantially parallel optical beams, the optical beam array forming a sequence of spot-grid array patterns;
 optics positioned to receive the optical beam array and for focusing the optical beams onto the substrate; and
 a movable stage for introducing a linear movement between the substrate and the focused optical beams in a direction slanted relative to the axes of the beam array, the translation synchronized with sequence of patterns for superimposing the patterns to form a final image on the substrate.

42. The printer of claim 41 wherein the optical radiation source comprises a microlens array.

43. A printer adapted for use with a substrate layered with a memoryless resist, the printer comprising:
 an optical radiation source for providing an array of substantially parallel optical beams, the array of optical beams forming a spot-grid array pattern;
 a beam shaper for narrowing the optical beams;
 optics positioned to receive the narrowed modulated optical beams for focusing the narrowed modulated optical beams onto the substrate;
 a movable stage for introducing a linear movement between the substrate and the focused narrowed modulated optical beams, the translation providing for a slanted scans,
 a detector coupled to the stage for detecting positional errors; and
 a compensator for varying the path of the optical beams to compensate for positional errors.

44. The printer of claim 43, wherein the optical radiation source provides a sequence of spot-grid array patterns, each corresponding to an intermediate pattern on the substrate, and the superposition of the intermediate patterns forms a final image on the substrate.

* * * * *